(12) United States Patent
Okada

(10) Patent No.: US 10,529,559 B2
(45) Date of Patent: Jan. 7, 2020

(54) METHOD OF MANUFACTURING SEMICONDUCTOR DEVICE, AND SEMICONDUCTOR MANUFACTURING APPARATUS

(71) Applicant: TOKYO ELECTRON LIMITED, Tokyo (JP)

(72) Inventor: Mitsuhiro Okada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 39 days.

(21) Appl. No.: 15/624,432

(22) Filed: Jun. 15, 2017

(65) Prior Publication Data

US 2017/0365465 A1 Dec. 21, 2017

(30) Foreign Application Priority Data

Jun. 20, 2016 (JP) .................................. 2016-121874

(51) Int. Cl.
| | |
|---|---|
| *H01L 21/02* | (2006.01) |
| *C23C 16/24* | (2006.01) |
| *C23C 16/455* | (2006.01) |
| *C23C 16/52* | (2006.01) |
| *H01L 21/3065* | (2006.01) |
| *H01L 21/67* | (2006.01) |

(52) U.S. Cl.
CPC ........ *H01L 21/02532* (2013.01); *C23C 16/24* (2013.01); *C23C 16/455* (2013.01); *C23C 16/52* (2013.01); *H01L 21/0262* (2013.01); *H01L 21/02164* (2013.01); *H01L 21/02238* (2013.01); *H01L 21/02636* (2013.01); *H01L 21/3065* (2013.01); *H01L 21/67069* (2013.01); *H01L 21/67109* (2013.01)

(58) Field of Classification Search
CPC ...................... H01L 21/02532; C23C 16/0227
See application file for complete search history.

(56) References Cited

U.S. PATENT DOCUMENTS

| | | | | | |
|---|---|---|---|---|---|
| 5,573,973 | A | * | 11/1996 | Sethi | ................. H01L 21/76232 148/DIG. 138 |
| 6,774,045 | B1 | * | 8/2004 | Liu | ................... H01L 21/02071 438/694 |
| 2014/0199824 | A1 | * | 7/2014 | Komori | ............. H01L 21/32055 438/478 |

FOREIGN PATENT DOCUMENTS

| | | |
|---|---|---|
| JP | 3093445 B2 | 7/2000 |
| JP | 2000-294626 A | 10/2000 |

(Continued)

*Primary Examiner* — Mohammad M Choudhry
(74) *Attorney, Agent, or Firm* — Nath, Goldberg & Meyer; Jerald L. Meyer

(57) ABSTRACT

There is provided a method of manufacturing a semiconductor device, which includes: forming a silicon film inside a recess formed in a surface of a workpiece by supplying a film forming gas containing silicon to the workpiece; subsequently, supplying a process gas, which includes a halogen gas for etching the silicon film and a roughness suppressing gas for suppressing roughening of a surface of the silicon film after being etched by the halogen gas, to the workpiece; etching the silicon film formed on a side wall of the recess to enlarge an opening width of the recess by applying thermal energy to the process gas and activating the process gas; and subsequently, filling silicon into the recess by supplying the film forming gas to the workpiece and depositing silicon on the silicon film remaining in the recess.

8 Claims, 7 Drawing Sheets

(56) References Cited

FOREIGN PATENT DOCUMENTS

| | | |
|---|---|---|
| JP | 2007-103876 A | 4/2007 |
| JP | 2015-32712 A | 2/2015 |
| JP | 2015-126161 A | 7/2015 |

* cited by examiner

METHOD OF MANUFACTURING SEMICONDUCTOR DEVICE, AND SEMICONDUCTOR MANUFACTURING APPARATUS

CROSS-REFERENCE TO RELATED APPLICATION

This application is based upon and claims the benefit of priority from Japanese Patent Application No. 2016-121874, filed on Jun. 20, 2016, the entire contents of which are incorporated herein by reference.

TECHNICAL FIELD

The present disclosure relates to a technology for supplying a film forming gas containing silicon to a workpiece and filling silicon into a recess formed in a surface of the workpiece.

BACKGROUND

For example, in order to form a logic element of a semiconductor device, there may be a case where a process of forming a silicon layer is performed by supplying a film forming gas containing silicon to a surface of a semiconductor wafer (hereinafter referred to as a wafer) as a substrate, and filling silicon into a recess formed downward in the surface of the wafer.

It is sometimes the case that the recess is formed so that the top portion of the inner side wall thereof bulges out and an opening width at an upper side in the recess is smaller than an opening width at a lower side. If the film forming gas is supplied to the recess having such a shape for a relatively long period of time, the upper portion of the recess is closed before the filling of silicon into the recess is completed, whereby voids may be included in a silicon layer formed inside the recess. Thus, silicon may sometimes be filled into the recess by a method called DED (Deposition Etch Deposition). In this method, a first-round film forming process of primarily supplying a film forming gas, an etching process of supplying an etching gas, and a second-round film forming process of secondarily supplying the film forming gas are performed in this order. For example, a process is used to plasmarize an etching gas, which is a mixed gas of a chlorine gas and a hydrogen bromide gas, and etch silicon existing on a surface of a wafer.

Describing the above DED method in more detail, the first-round film forming process is completed before the clogging of the upper portion of the recess occurs, thereby obtaining a state in which a silicon film is formed inside the recess. The subsequent etching process is performed so that the opening width at the upper side in the recess is enlarged and the silicon film remains in the recess. In the second-round film forming process after the etching is performed in this manner, silicon is filled into the recess while suppressing the formation of the aforementioned voids.

In order to perform the etching process described above, as the etching gas, a gas having relatively high reactivity with silicon, for example, a chlorine gas, is used so as to react with the silicon film at the upper side of the recess before reaching the lower side of the recess. However, if the etching is performed with this chlorine gas, the roughness of the surface of the silicon film becomes relatively large. Since the reason will be described in detail in the Detailed Description section of the present disclosure, brief descriptions are offered here. If silicon is deposited on the surface of the silicon film having relatively large roughness during the second-round film forming process, there is concern that micro voids are included in a silicon layer formed inside the recess, or seams are formed in the silicon layer. When subjecting the silicon layer to anisotropic etching, the etching may progress greatly because the density of silicon is lower at locations where the voids or seams are formed than at other locations.

SUMMARY

Some embodiments of the present disclosure provide a technique capable of preventing voids from being included in a silicon layer or seams from being formed in the silicon layer, when the silicon layer is formed by supplying a film forming gas containing silicon to a workpiece having a recess formed in a surface thereof and filling silicon into the recess.

According to one embodiment of the present disclosure, there is provided a method of manufacturing a semiconductor device, which includes: forming a silicon film inside a recess formed in a surface of a workpiece by supplying a film forming gas containing silicon to the workpiece; subsequently, supplying a process gas, which includes a halogen gas for etching the silicon film and a roughness suppressing gas for suppressing roughening of a surface of the silicon film after being etched by the halogen gas, to the workpiece; etching the silicon film formed on a side wall of the recess to enlarge an opening width of the recess by applying thermal energy to the process gas and activating the process gas; and subsequently, filling silicon into the recess by supplying the film forming gas to the workpiece and depositing silicon on the silicon film remaining in the recess.

According to another embodiment of the present disclosure, there is provided a semiconductor manufacturing apparatus includes: a vacuum container configured to accommodate a workpiece; a heating part configured to heat the workpiece; a film forming gas supply part configured to supply a film forming gas containing silicon into the vacuum container; an etching gas supply part configured to supply a halogen gas for etching a silicon film into the vacuum container; a roughness suppressing gas supply part configured to supply a roughness suppressing gas for suppressing roughening of a surface of the silicon film after being etched by the halogen gas; and a control part configured to output control signals so as to perform: forming a silicon film inside a recess formed in a surface of the workpiece by supplying the film forming gas containing silicon to the workpiece; subsequently supplying a process gas including the halogen gas and the roughness suppressing gas to the workpiece; etching the silicon film formed on a side wall of the recess to enlarge an opening width of the recess by applying thermal energy to the process gas and activating the process gas; and subsequently filling silicon into the recess by supplying the film forming gas to the workpiece and depositing the silicon on the silicon film remaining in the recess.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
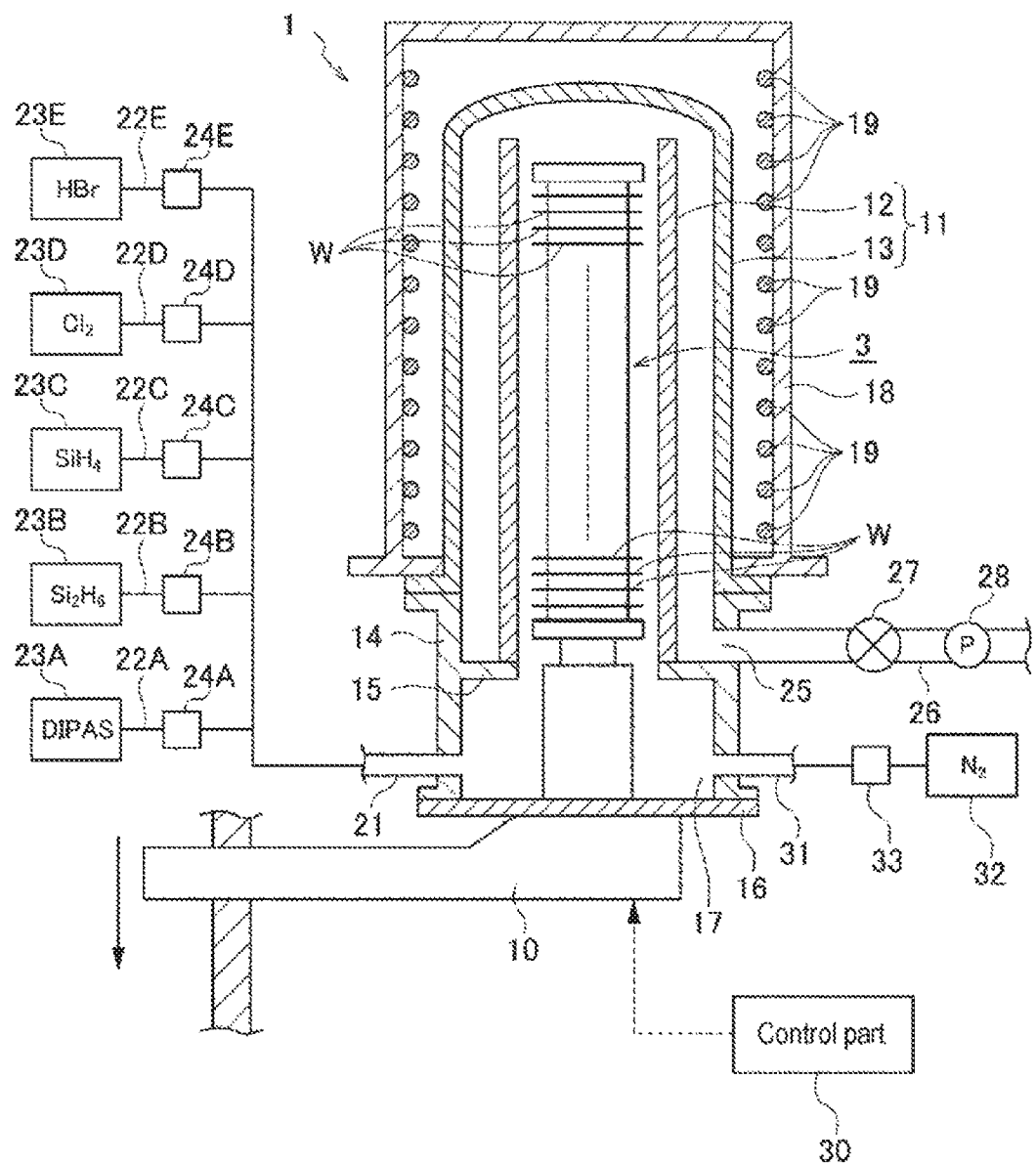
FIG. 1 is a vertical sectional side view of a vertical heat treatment apparatus as an embodiment of a semiconductor manufacturing apparatus of the present disclosure.

A vertical heat treatment apparatus 1, which is an embodiment of a semiconductor manufacturing apparatus according to the present disclosure, will be described with reference to a vertical sectional side view of FIG. 1. In this vertical heat treatment apparatus 1, in order to form a logic element of a semiconductor device on a wafer W as a substrate, the DED described in the Background section of the present disclosure is performed. That is to say, a film forming process and an etching process are performed on the wafer W. This film forming process is a process using a thermal CVD (Chemical Vapor Deposition), and the etching process is a reactive gas etching process performed by supplying thermal energy to an etching gas.

The vertical heat treatment apparatus 1 is provided with a reaction tube 11 as a substantially cylindrical vacuum container whose longitudinal direction is oriented in the vertical direction. The reaction tube 11 has a double tube structure composed of an inner tube 12 and an outer tube 13 with a ceiling configured to cover the inner tube 12 and spaced apart by a certain distance from the inner tube 12. The inner tube 12 and the outer tube 13 are made of a heat-resistant material, for example, quartz.

A manifold 14 made of stainless steel (SUS) and formed in a cylindrical shape is disposed below the outer tube 13. The manifold 14 is airtightly connected to a lower end of the outer tube 13. Further, the inner tube 12 is supported by a support ring 15 formed to protrude from an inner wall of the manifold 14 and integrally formed with the manifold 14.

A lid 16 is disposed below the manifold 14. The lid 16 is configured to be vertically movable between a raised position and a lowered position by a boat elevator 10. FIG. 1 shows the lid 16 located at the raised position. In this raised position, the lid 16 closes an opening 17 of the reaction tube 11 existing on the lower side of the manifold 14, thereby keeping the inside of the reaction tube 11 airtight. A wafer boat 3 made of, for example, quartz, is mounted on the lid 16. The wafer boat 3 is configured to horizontally hold a plurality of wafers W as workpieces at predetermined vertical intervals. A heat insulator 18 is installed around the reaction tube 11 so as to surround the reaction tube 11. For example, a heater 19 as a heating part composed of a resistance heating element is installed on an inner wall surface of the heat insulator 18. The heater 19 can heat the inside of the reaction tube 11.

In the manifold 14, a process gas introduction pipe 21 and a purge gas introduction pipe 31 are inserted below the support ring 15. Downstream ends of the respective gas introduction pipes 21 and 31 are disposed so as to be able to supply respective gases to the wafers W existing inside the inner tube 12. For example, an upstream side of the process gas introduction pipe 21 is branched to form branch paths 22A to 22E. Upstream ends of the branch paths 22A to 22E are respectively connected to a supply source 23A of a diisopropylaminosilane (DIPAS) gas, a supply source 23B of a disilane ($Si_2H_6$) gas, a supply source 23C of a mono-aminosilane ($SiH_4$) gas, a supply source 23D of a chlorine ($Cl_2$) gas, and a supply source 23E of a hydrogen bromide (HBr) gas. Gas supply mechanisms 24A to 24E are installed in the branch paths 22A to 22E, respectively. Each of the gas supply mechanisms 24A to 24E includes a valve and a mass flow controller. The gas supply mechanisms 24A to 24E are configured to control flow rates of respective process gases supplied from the gas supply sources 23A to 23E to the process gas introduction pipe 21.

The $SiH_4$ gas is a film forming gas for forming a silicon (Si) film on the wafer W. The gas supply source 23C and the gas supply mechanism 24C constitute a film forming gas supply part. The $Cl_2$ gas is an etching gas for etching the Si film. The gas supply source 23D and the gas supply mechanism 24D constitute an etching gas supply part. The HBr gas is a roughness-suppressing gas for increasing the planarity of a surface of the Si film thus etched. The gas supply source 23E and the gas supply mechanism 24E constitute a roughness-suppressing gas supply part.

Further, an upstream side of the purge gas introduction pipe 31 is connected to a supply source 32 of a nitrogen ($N_2$) gas which is a purge gas. A gas supply mechanism 33 is installed in the purge gas introduction pipe 31. The gas supply mechanism 33 is configured similarly to the gas supply mechanisms 24A to 24E. The gas supply mechanism 33 controls a flow rate of the purge gas supplied to a downstream side of the purge gas introduction pipe 31.

An exhaust port 25 is opened in the side surface of the manifold 14 above the support ring 15. An exhaust gas or the like generated inside the inner tube 12 is exhausted from the exhaust port 25 through a space formed between the inner tube 12 and the outer tube 13. An exhaust pipe 26 is airtightly connected to the exhaust port 25. In the exhaust pipe 26, a valve 27 and a vacuum pump 28 are installed in this order from the upstream side thereof. By adjusting an opening degree of the valve 27, an internal pressure of the reaction tube 11 is controlled to a desired pressure.

The vertical heat treatment apparatus 1 is provided with a control part 30 composed of a computer. The control part 30 is provided with a program. The program outputs control signals to the respective parts of the vertical heat treatment apparatus 1 so that a series of process operations described below can be performed on the wafer W. The program incorporates a group of steps so as to control the operations of the respective parts. Specifically, the control signals are outputted so as to control the raising/lowering operation of the lid 16 performed by the boat elevator 10, the output of the heater 19 (namely, the temperature of the wafer W), the opening degree of the valve 27, the flow rates of the respective gases supplied into the reaction tube 11 performed by the gas supply mechanisms 24A to 24E and 33, and the like. The program is stored in the control part 30 in a state in which the program is stored in a storage medium such as a hard disk, a flexible disk, a compact disk, a magneto-optical disk (MO disk), a memory card, or the like.

Figure 2:
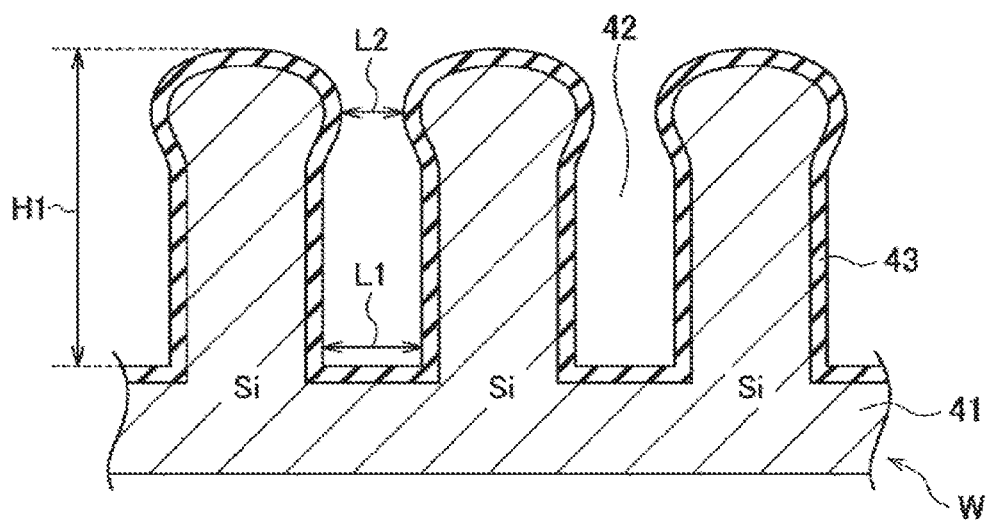
FIG. 2 is a vertical sectional side view of a wafer processed by the vertical heat treatment apparatus.

Next, a surface portion of the wafer W to be processed by the vertical heat treatment apparatus 1 will be described with reference to the vertical sectional side view of FIG. 2. The surface portion of the wafer W includes a silicon (Si) layer 41. A large number of recesses 42 are formed in the Si layer 41. Top portions of side walls constituting the respective recesses 42 bulge out in the lateral direction. Therefore, an opening width L2 at the upper side of the respective recess 42 is smaller than an opening width L1 at the lower side (the bottom side) of the respective recess 42. In addition, the top surface of the Si layer 41 is oxidized and is configured as a silicon oxide film 43. In FIG. 2, the height of the inside of the recess 42 is indicated by H1. An aspect ratio (height H1/opening width L2 at the upper side) of the recess 42 is, for example, 2 or more.

Next, the processes performed in the vertical heat treatment apparatus 1 will be described with reference to FIGS. 3 to 6 which illustrate how the vertical cross section of the wafer W is changed. First, the wafer W described with reference to FIG. 2 is transferred to and held by the wafer boat 3 by a transfer mechanism (not shown). Thereafter, the wafer boat 3 is mounted on the lid 16 positioned at the lowered position. Then, the lid 16 is moved up toward the raised position. The wafer boat 3 is carried into the reaction tube 11. The opening 17 of the reaction tube 11 is closed by the lid 16, whereby the inside of the reaction tube 11 is kept airtight. Subsequently, the purge gas is supplied into the reaction tube 11 and the interior of the reaction tube 11 is exhausted to become a vacuum atmosphere of a predetermined pressure. The wafer W is heated by the heater 19 so as to have a predetermined temperature.

Thereafter, the supply of the purge gas is stopped, and the DIPAS gas is supplied into the reaction tube 11. The DIPAS gas is deposited on the surface of the silicon oxide film 43 of the wafer W. A first seed layer is formed so as to cover the silicon oxide film 43. Thereafter, the supply of the DIPAS gas is stopped, and the purge gas is supplied into the reaction tube 11. After the DIPAS gas is purged from the inside of the reaction tube 11, the $Si_2H_6$ gas is supplied into the reaction tube 11. The $Si_2H_6$ gas is deposited on the first seed layer. A second seed layer is formed to cover the first seed layer. Thereafter, the supply of the $Si_2H_6$ gas is stopped, and the purge gas is supplied into the reaction tube 11. Thus, the $Si_2H_6$ gas is purged from the inside of the reaction tube 11.

Figure 3:
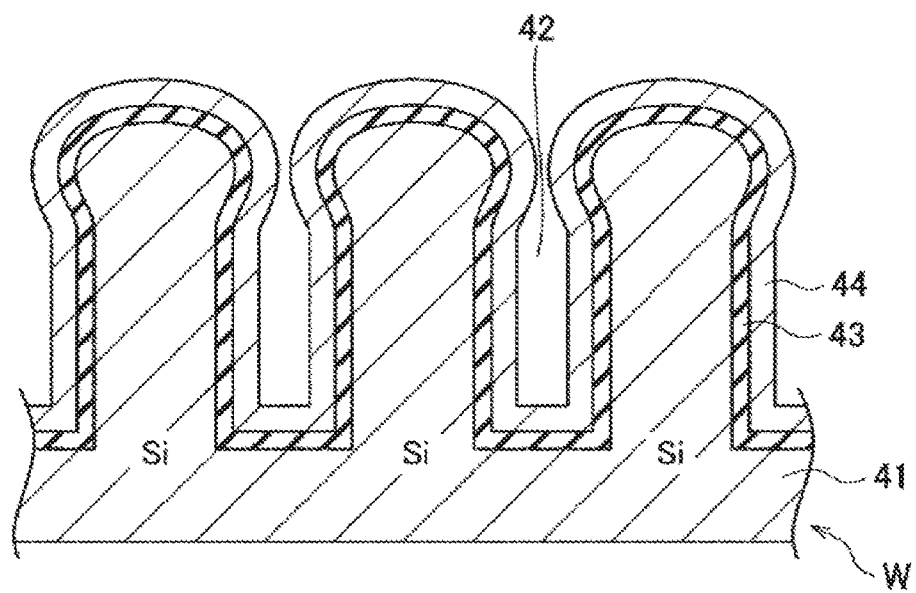
FIG. 3 is a vertical sectional side view of a wafer processed by the vertical heat treatment apparatus.

Thereafter, the supply of the purge gas is stopped, and the $SiH_4$ gas is supplied into the reaction tube 11. The $SiH_4$ gas is deposited on the second seed layer. Thus, a Si film 44 is formed on the entire surface of the wafer W so as to cover the second seed layer. Then, the deposition of the $SiH_4$ gas is continued so that the Si film 44 grows. That is to say, a film thickness of the Si film 44 increases. Then, for example, as shown in FIG. 3, the supply of the $SiH_4$ gas is stopped before the upper side of the recess 42 is closed by the Si film 44. Since the thicknesses of the first seed layer and the second seed layer is very small, an illustration thereof is omitted in respective figures including FIG. 3.

Figure 4:
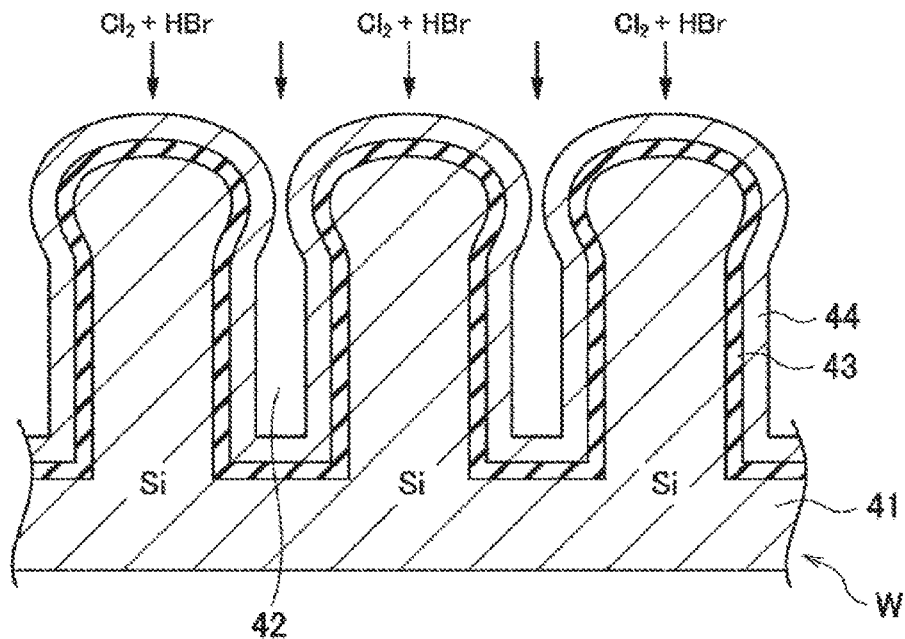
FIG. 4 is a vertical sectional side view of a wafer processed by the vertical heat treatment apparatus.

After the supply of the $SiH_4$ gas is stopped, the purge gas is supplied into the reaction tube 11. Thus, the $SiH_4$ gas is purged from the inside of the reaction tube 11. While performing this purging operation, for example, the temperature of the wafer W is set to fall within a range of 250 to 450 degrees C., for example, 400 degrees C., and the internal pressure of the reaction tube 11 is set to fall within a range of, for example, 2 Pa (0.15 Torr) to $5.33 \times 10^3$ Pa (4 Torr). Then, the $Cl_2$ gas and the HBr gas are supplied to the process gas introduction pipe 21 where they are mixed. The $Cl_2$ gas and the HBr gas thus mixed are supplied to the wafer W inside the reaction tube 11 (FIG. 3). In order to reliably obtain the etching effect based on the $Cl_2$ gas and the effect of roughening suppression of the Si film 44 based on the HBr gas (to be described later), for example, the HBr gas and the $Cl_2$ gas are supplied so that the flow rate of the HBr gas/the flow rate of the $Cl_2$ gas becomes 1/4 or more. More specifically, for example, the $Cl_2$ gas is supplied at 1,000 sccm and the HBr gas is supplied at 250 to 1,000 sccm into the reaction tube 11 (FIG. 4).

The $Cl_2$ gas is an etching gas for etching the Si film 44. The $Cl_2$ gas is heated inside the reaction tube 11 and supplied with thermal energy, thereby generating active species such as radicals of Cl or the like. Such active species have a relatively high reactivity with Si. Thus, the active species react with Si outside of the recess 42 and at the upper side in the recess 42 until they reach the lower region in the recess 42 of the wafer W, thereby generating $SiCl_4$ (silicon tetrachloride) which etches the Si film 44. Accordingly, such an etching is performed so that the decrease in the film thickness of the Si film 44 at the upper side in the recess 42 becomes larger than the decrease in the film thickness of the Si film 44 at the lower side in the recess 42. As a result, the opening width at the upper side is enlarged. 2 moles of Cl radicals are produced from 1 mole of $Cl_2$. Since a relatively large number of active species are generated, the enlargement of the opening width can progress at a relatively high speed.

Incidentally, the HBr gas is a planarization-purpose process gas for planarizing the surface of the Si film 44 etched by the $Cl_2$ gas. As described in the Background section of the present disclosure, when the $Cl_2$ gas in the HBr gas and the $Cl_2$ gas is supplied to the wafer W to perform etching, the roughness of the surface of the Si film 44 after completion of the etching is relatively large. However, it is possible to reduce the roughness of the surface of the Si film 44 by supplying the HBr gas and the $Cl_2$ gas to the wafer W and performing the etching as described later in an evaluation test. The reason why the roughness of the surface of the Si film 44 can be reduced in this way is considered to be that the heated HBr gas per se acts on the Si film 44, or HCl (hydrochloric acid) generated by the reaction of H radicals out of H radicals and Br radicals generated by heating the HBr gas with Cl radicals generated from the aforementioned $Cl_2$ gas acts on the Si film 44.

Figure 5:
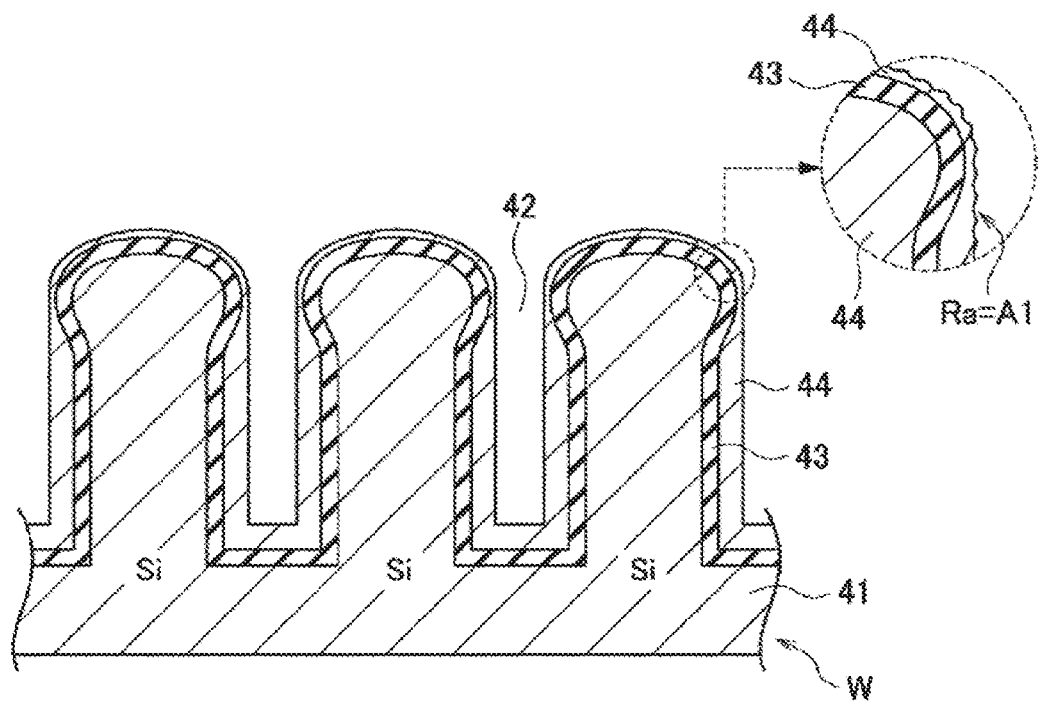
FIG. 5 is a vertical sectional side view of a wafer processed by the vertical heat treatment apparatus.

Thereafter, the supply of the $Cl_2$ gas and the HBr gas into the reaction tube 11 is stopped, and the etching process is completed (FIG. 5). As described above, the etching of the Si film 44 is suppressed at the lower side in the recess 42 during the etching process. Therefore, at the end of the etching, as shown in FIG. 5, the Si film 44 remains in the recess 42. As described above, the planarity of the surface of the Si film 44 remaining in this manner is relatively high.

Figure 6:
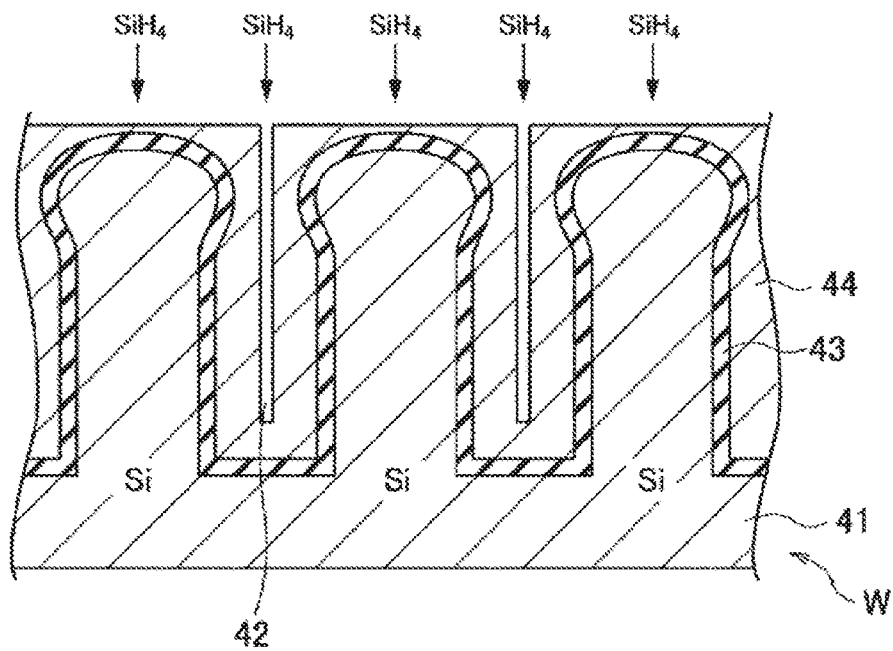
FIG. 6 is a vertical sectional side view of a wafer processed by the vertical heat treatment apparatus.
Figure 7:
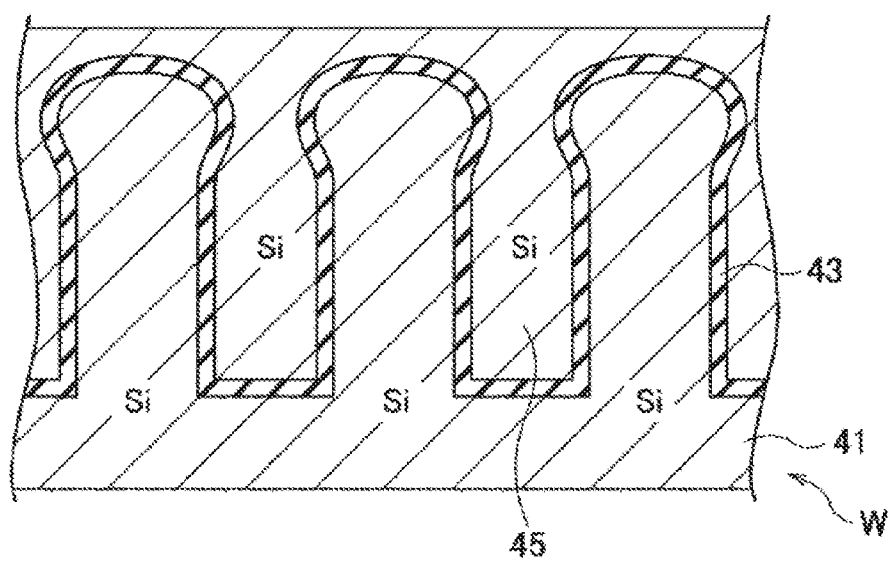
FIG. 7 is a vertical sectional side view of a wafer processed by the vertical heat treatment apparatus.

While the purge gas is supplied to remove the mixed gas from the reaction tube 11, the temperature of the wafer W is set to a predetermined temperature and the internal pressure of the reaction tube 11 is set to a predetermined vacuum pressure. Then, the supply of the purge gas is stopped, and the $SiH_4$ gas is supplied into the reaction tube 11. The $SiH_4$ gas is deposited on the Si film 44 so that the Si film 44 grows. Since the gas is deposited on the surface of the Si film 44 having relatively high planarity in this way, the planarity of the surface of the Si film 44 under growth is also relatively high as shown in FIG. 6. As the growth of the Si film 44 progresses, the surfaces of the Si films 44 grown from the side surfaces of the recess are joined to each other in the recess 42, thereby forming a Si layer 45 (FIG. 7). Since the planarity of the surfaces of the Si films 44 joined to each other is relatively high, it is possible to prevent voids from being included in the joined portion and to prevent seams from being formed in the joined portion.

Thereafter, the supply of the $SiH_4$ gas into the reaction tube 11 is stopped, and the film forming process is completed. Then, the purge gas is supplied to remove the $SiH_4$ gas from the reaction tube 11. Meanwhile, the temperature of the wafer W drops. Subsequently, after the lid 16 is moved down and the wafer boat 3 is carried out from the reaction tube 11, the wafer W is taken out from the wafer boat 3 by a transfer mechanism (not shown). In a later process for manufacturing a logic device of a semiconductor device, for example, the Si layer 45 formed in the recess 42 is subjected to anisotropic etching and removed downward. The etching of the Si layer 45 is performed, for example, so that the Si layer 41 constituting the bottom of the recess 42 is not etched. Since voids and seams are not formed in the Si layer 45 at the time of etching the Si layer 45, the etching of the Si layer 45 progresses with high uniformity in the respective regions. It is therefore possible to prevent the Si layer 41 from being etched.

Figure 9:
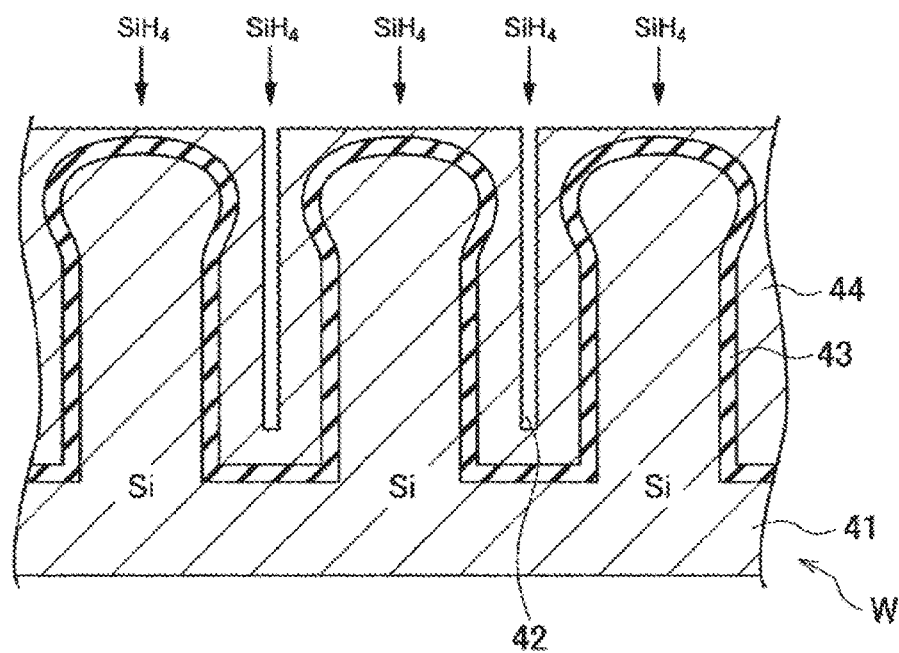
FIG. 9 is a vertical sectional side view of a wafer subjected to a process of a comparative example.
Figure 10:
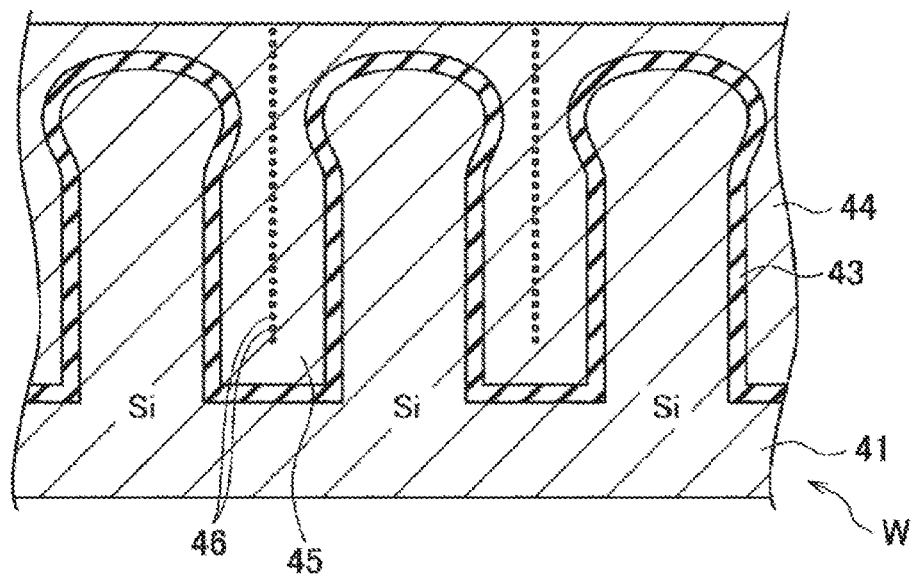
FIG. 10 is a vertical sectional side view of a wafer subjected to a process of a comparative example.

In order to clearly show the effects achieved by the processes described with reference to FIGS. 3 to 7 (hereinafter sometimes referred to as the process of the example), the process of a comparative example will be described with reference to FIGS. 8 to 10 which show how the vertical cross section of the wafer W is changed. The process of the comparative example is the same as the process of the example except that only the $Cl_2$ gas is supplied instead of supplying the mixed gas of the $Cl_2$ gas and the HBr gas to the wafer W during the etching of the Si film 44. First, the Si film 44 is formed after the formation of the first seed layer and the second seed layer. Thereafter, the $Cl_2$ gas is supplied to the wafer W to etch the Si film 44.

Figure 8:
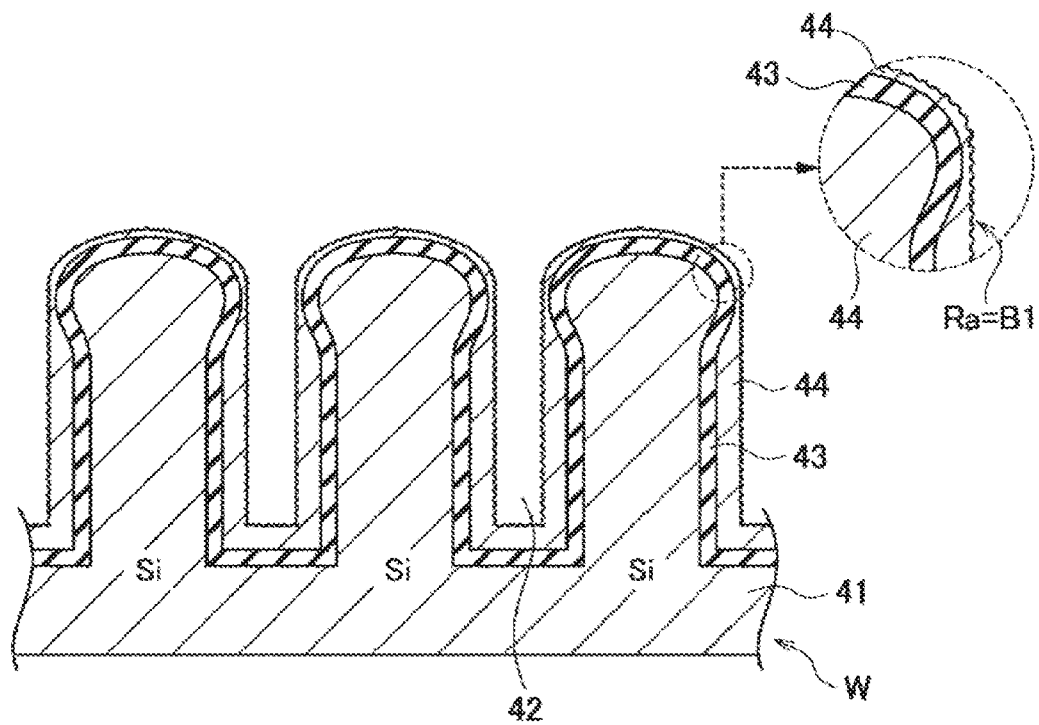
FIG. 8 is a vertical sectional side view of a wafer subjected to a process of a comparative example.

FIG. 8 shows the wafer W available at the end of the etching. As described above, the roughness of the surface of the remaining Si film 44 is relatively large. In FIG. 5 and FIG. 8 described above, the enlarged cross section of the Si film 44 is shown in a dotted line circle at the end of an arrow.

Thereafter, the $SiH_4$ gas is supplied to the wafer W. The $SiH_4$ gas is deposited on the surface of the Si film 44 remaining in the recess 42 so that the Si film 44 grows. However, since the roughness of the Si film 44 before growth is large, the planarity of the surface of the Si film 44 during growth is also relatively low as shown in FIG. 9. As a result, when the surfaces of the Si films 44 grown from the side surfaces in the recess 42 are joined to each other and the Si layer 45 is formed in the recess 42, minute voids 46 and seams are formed in the joined portion (FIG. 10).

As is apparent from the process of the comparative example described above, according to the process of the example described above, it is possible to increase the planarity of the Si film 44 remaining in the recess 42 by supplying the $Cl_2$ gas and the HBr gas to the wafer W and performing the etching. Thus, when the Si layer 45 is formed in the recess 42 by depositing the $SiH_4$ gas on the Si film 44, it is possible to suppress the formation of voids and seams in the Si layer 45.

In the process of the example, the surface roughness Ra of the Si film 44 after performing the etching as shown in FIG. 5 and before filling silicon into the recess 42 is assumed to be A1. Furthermore, in the process of the comparative example, the surface roughness Ra of the Si film 44 after performing the etching as shown in FIG. 8 and before filling silicon into the recess 42 is assumed to be B1. In some embodiments, for example, a ratio of A1 to B1 may be 0.8 or less. According to a result of an experiment, A1 was 0.18 nm and B1 was 0.25 nm. That is to say, a ratio of A1 to B1 was 0.72.

The present disclosure is not limited to the process of the example described above, but may be carried out in various modifications. For example, in the process of the example described above, the $Cl_2$ gas and the HBr gas are mixed with each other before being supplied to the reaction tube 11. However, the $Cl_2$ gas and the HBr gas may be supplied into the reaction tube 11 from separate paths and may be mixed on the surface of the wafer W. Furthermore, in the process of the example described above, after the Si film 44 is formed by performing the film forming process on the silicon oxide film 43, silicon is filled into the recess 42 by performing the etching process and the film forming process once. However, after forming the Si film 44, silicon may be filled into the recess 42 by repeating the etching process and the film forming process a multiple number of times.

Further, when the surface of the Si film 44 is planarized by the action of HCl described above, instead of the HBr gas, an HCl gas may be supplied as a roughness suppressing gas into the reaction tube 11, and the $Cl_2$ gas-based etching process then may be performed. In addition, an HI (hydrogen iodide) gas is a compound composed of halogen and hydrogen just like the HBr gas. The electronegativity of each of Br (bromine) and I (iodine) shows values close to each other. Thus, the HBr gas and the HI gas show similar properties to each other. Accordingly, it is considered that even if the HI gas is supplied into the reaction tube 11 instead of the HBr gas, the same effect as in the case of supplying the HBr gas is achieved. It is therefore possible to supply the HI gas as the roughness suppressing gas. In addition, the halogen gas used for etching is not limited to the $Cl_2$ gas. For example, an $F_2$ (fluorine) gas or a $Br_2$ (bromine) gas may be used as the halogen gas.

(Evaluation Tests)

Evaluation tests conducted in connection with the present disclosure will be described. Using the vertical heat treatment apparatus 1 described above, the Si film 44 formed on the surface of the wafer W was subjected to the same etching process as the etching process in the process of the example described above. As process conditions, the temperature of the wafer W was set at 400 degrees C., the internal pressure of the reaction tube 11 was set at 26.6 Pa, and the flow rate of the $Cl_2$ gas was set at 1,000 sccm. The flow rate of the HBr gas was changed in a range of 0 to 1,000 sccm each time when the process is performed. With respect to each of the etched wafers W, the etching rate (etched amount per unit time) of the Si film 44, the Haze of the surface of the Si film 44 remaining on the wafer W, and WinW were measured.

The Haze was measured by irradiating a laser beam on the wafer W with a dark-field inspection apparatus and measuring a low frequency signal generated by receiving scattered lights at a light receiving part of the dark-field inspection apparatus. The WinW was calculated by measuring the etching rates at many locations in the plane of the wafer W and performing calculations based on the following Equation 1. As the absolute value of this value becomes lower, the etching uniformity in the plane of the wafer W grows higher.

$$WinW(\pm\%) = \pm(\text{maximum value of etching rate} - \text{minimum value of etching rate})/(\text{average value of etching rate}) \times 100/2 \quad \text{Equation 1}$$

Figure 11:
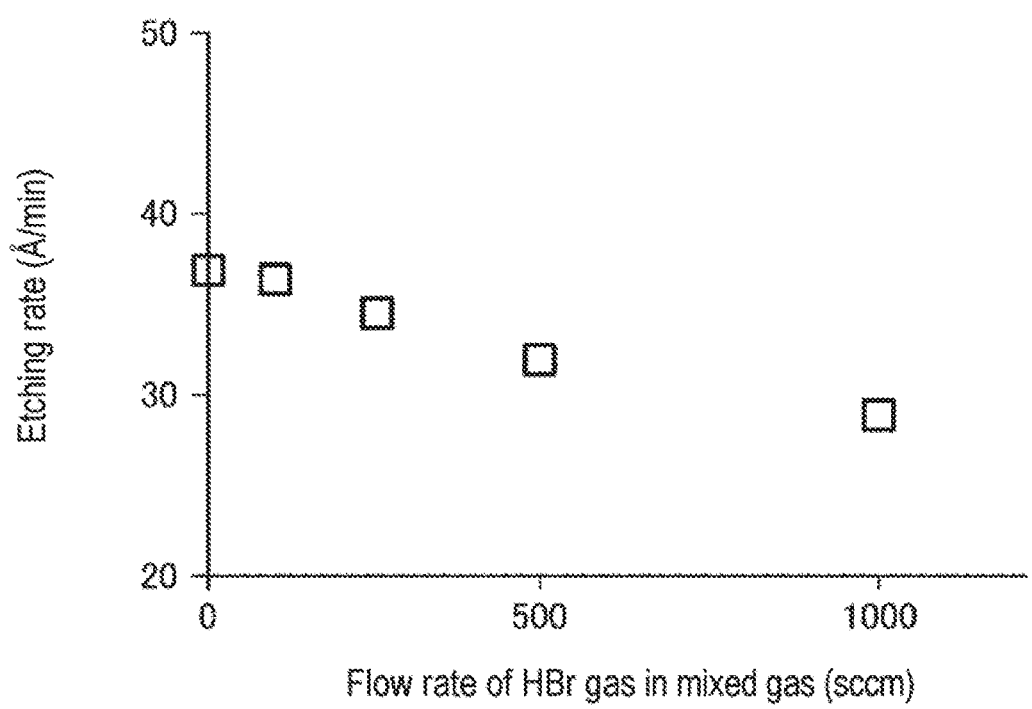
FIG. 11 is a graph showing the results of an evaluation test.
Figure 12:
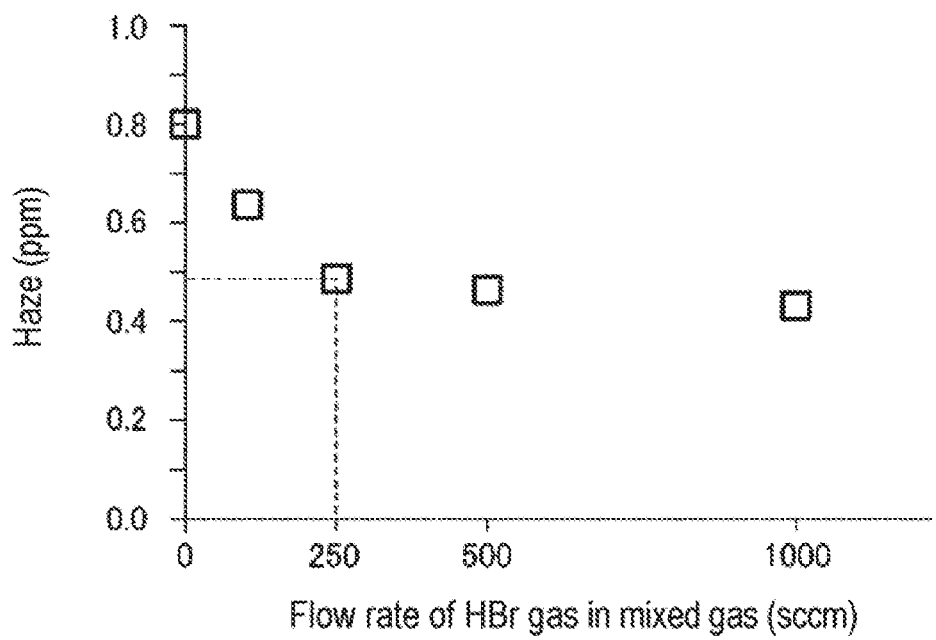
FIG. 12 is a graph showing the results of an evaluation test.
Figure 13:
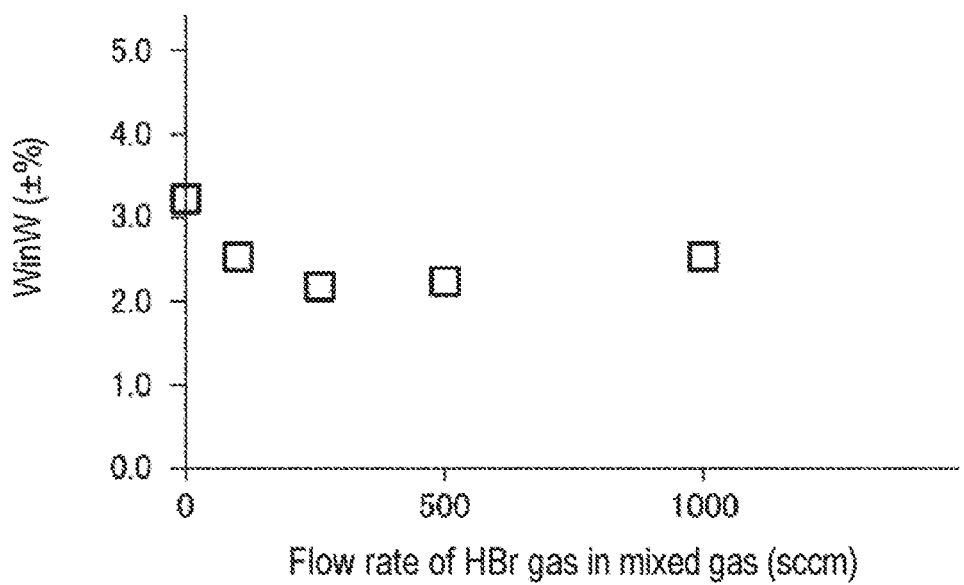
FIG. 13 is a graph showing the results of an evaluation test.

FIGS. 11 to 13 are graphs showing the results of the evaluation tests. The horizontal axis of each graph represents the flow rate (unit: sccm) of the HBr gas. The vertical axis in the graph of FIG. 11 represents the etching rate (unit: Å/min). The vertical axis in the graph of FIG. 12 represents the Haze (unit: ppm), the vertical axis in the graph of FIG. 13 represents the WinW (unit: +%). As shown in the graph of FIG. 11, in the range of 0 to 1,000 sccm which is set as the flow rate of the HBr gas, the etching rate becomes lower as the flow rate of the HBr gas grows higher. However, the etching rate available when the HBr gas is 0 sccm is 37.05 Å/min and the etching rate available when the HBr gas is 1,000 sccm is 28.96 Å/min. Thus, no large difference between these etching rates was shown. That is to say, it can be noted that even when the HBr gas is supplied together with the $Cl_2$ gas, the etching action of the $Cl_2$ gas on the Si film 44 is not greatly affected.

From the graph of FIG. 12, it can be seen that the Haze value shows a smaller value as the flow rate of the HBr gas becomes higher. That is to say, the greater the flow rate of the HBr gas, the higher the planarity of the Si film 44 after etching. Specifically, the Haze value was 0.809 ppm when the flow rate of the HBr gas is 0 sccm, and the Haze value was 0.440 ppm when the flow rate of the HBr gas is 1,000 sccm Therefore, from the results of this evaluation test, it was confirmed that the planarity of the Si film 44 can be increased by supplying the HBr gas together with the $Cl_2$ gas and performing the etching. Further, from the graph, it was confirmed that the Haze value is not greatly changed and is at a level of 0.5 ppm or less in the range where the flow rate of the HBr gas is 250 sccm or more, namely a ratio of the flow rate of the HBr gas to the flow rate of the $Cl_2$ gas is 1/4 or more. That is to say, in this range, the Haze can be kept particularly low.

As described above, in these evaluation tests, the Haze is approximately 0.8 ppm when the flow rate of the HBr gas is 0 sccm, and the Haze is approximately 0.5 ppm when the flow rate of the HBr gas ranges from 250 to 1,000 sccm. From these results, assuming that the Haze of the surface of the Si film 44 after completion of the etching process of the Si film 44 in the process of the example described above is A ppm and the Haze of the surface of the Si film 44 after completion of the first-round film forming process of the Si film 44 and the first-round etching process of the Si film 44 in the process of the comparative example is B ppm, when A/B=0.5/0.8=0.625, the roughness of the surface of the Si film 44 is suppressed to almost limit. Therefore, it can be said that the roughness of the surface of the Si film 44 is sufficiently suppressed when A/B is 0.8 or less and that the roughness of the surface of the Si film 44 is further sufficiently suppressed when A/B is 0.7 or less. In the process of the example described above, it is more preferable that the HBr gas is supplied so as to obtain such a value.

Furthermore, as shown in the graph of FIG. 13, the value of WinW available when the HBr gas is supplied is smaller than the value of WinW available when the flow rate of the HBr gas is 0 sccm, namely when the HBr gas is not supplied. That is to say, by supplying the HBr gas, it is possible to increase the in-plane etching uniformity. Specifically, the WinW was 3.19% when the flow rate of the HBr gas is 0 sccm, and the WinW was 2.58% when the flow rate of the HBr gas is 1,000 sccm. Accordingly, it was confirmed that, by supplying the HBr gas to the wafer W together with the $Cl_2$ gas and performing the etching, it is possible not only to suppress the roughening of the Si film 44 but also to obtain the effect of increasing the in-plane etching uniformity According to the present disclosure, thermal energy is supplied to a process gas including a halogen gas as an etching gas and a roughness suppressing gas for planarizing a surface of an etched film, and a silicon film formed in a recess of a workpiece is etched. Thereafter, a film forming gas is supplied to deposit silicon on the remaining silicon film, thereby filling the recess with silicon. This makes it possible to increase the planarity of the surface of the silicon film grown in the recess. As a result, it is possible to prevent voids from being included in a silicon layer formed from the silicon film and to prevent seams from being formed in the silicon layer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a silicon film inside a recess formed in a surface of a workpiece by supplying a film forming gas containing silicon to the workpiece;
    subsequently, supplying a process gas to the workpiece, the process gas being a mixture gas of a halogen gas and a roughness suppressing gas, the roughness suppressing gas being a gaseous compound of halogen and hydrogen;
    heating the workpiece to generate halogen radicals from the halogen gas and to generate hydrogen radicals from the roughness suppressing gas;
    etching the silicon film formed on a side wall of the recess by the halogen radicals to enlarge an opening width of the recess, while suppressing roughening of a surface of the silicon film by the heated roughness suppressing gas acting on the silicon film or by a reaction product of the hydrogen radicals and the halogen radicals acting on the silicon film; and
    subsequently, filling silicon into the recess by supplying the film forming gas to the workpiece and depositing silicon on the silicon film remaining in the recess.

2. The method of claim 1, wherein the halogen gas is a chlorine gas.

3. The method of claim 1, wherein the heating the workpiece includes heating the workpiece at a range of 250 to 450 degrees C.

4. The method of claim 1, wherein a ratio of a flow rate of the roughness suppressing gas to a flow rate of the halogen gas is 1/4 or more.

5. The method of claim 1, wherein the roughness suppressing gas is a hydrogen bromide gas.

6. The method of claim 1, wherein a ratio of a first Haze value to a second Haze value is 0.8 or less, the first Haze value being a Haze value of the surface of the silicon film etched by the etching while suppressing the roughening, and the second Haze value being a Haze value of the surface of the silicon film available when the etching is performed without suppressing the roughening.

7. The method of claim 1, wherein the roughness suppressing gas is a hydrogen iodide gas.

8. The method of claim 1, wherein the halogen gas is a bromine gas.

* * * * *